(12) United States Patent
Nolan et al.

(10) Patent No.: US 6,424,211 B1
(45) Date of Patent: Jul. 23, 2002

(54) DIGITAL TRIMMING OF OP AMP OFFSET VOLTAGE AND QUIESCENT CURRENT USING NON-VOLATILE MEMORY

(75) Inventors: James B. Nolan, Chandler; Bonnie Baker, Tucson, both of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/604,120

(22) Filed: Jun. 26, 2000

(51) Int. Cl.[7] ................................................. H03F 1/02
(52) U.S. Cl. ................................................. 330/2; 330/9
(58) Field of Search ........................... 330/2, 9; 327/307

(56) References Cited

U.S. PATENT DOCUMENTS

| | | | |
|---|---|---|---|
| 5,473,758 A | 12/1995 | Allen et al. | 395/430 |
| 5,557,234 A | 9/1996 | Collins | 327/563 |
| 5,828,599 A | * 10/1998 | Herdt | 365/185.08 |
| 5,933,039 A | 8/1999 | Hui et al. | 327/262 |
| 6,034,569 A | * 3/2000 | Lan et al. | 330/9 X |
| 6,194,962 B1 | * 2/2001 | Chen | 330/9 |

OTHER PUBLICATIONS

Carley L. R: Trimming Analog Circuits Using Floating–Gate Analog MOS Memory: IEEE Journal of Solid–State Circuits, IEEE Inc. New York, US, vol. 24, No. 6 Dec. 1, 1989, pp. 1569–1575, XP000100488 ISSN: 0018–9200 p. 1572–p. 1573; figure 7.

"Verstaerker Zur Verstaerkung Kleiner Stroeme" Research Disclosure, Kenneth Mason Publications, Hampshire, GB, No. 338, Jun. 1, 1992, pp. 519–522, XP000315729 ISSN: 0374–4353.

Bindra, Ashok, Precision Op Amps Adopt Digital Techniques, Analog Outlook, Jul. 26, 1999, Electronic Design, beginning at p. 49.

* cited by examiner

Primary Examiner—Steven J. Mottola
(74) Attorney, Agent, or Firm—Swidler Berlin Shereff Friedman, LLP (57) ABSTRACT

An operational amplifier is trimmed electrically using non-volatile fuses. The non-volatile fuses may be programmed electrically without destroying any passivation layers or other devices on the electronic component. In the case of an integrated circuit analog component, the trimming may be performed either at the wafer level or at the packaging level. The trimming may be performed specifically to adjust the quiescent current or offset voltage of the operational amplifier.

26 Claims, 9 Drawing Sheets

(PRIOR ART)

(PRIOR ART)

DIGITAL TRIMMING OF OP AMP OFFSET VOLTAGE AND QUIESCENT CURRENT USING NON-VOLATILE MEMORY

FIELD OF THE INVENTION

The present invention relates generally to manufacturing techniques for electronic components and more particularly to techniques for calibrating and adjusting operating characteristics of electronic components by programming non-volatile memory within the electronic components.

BACKGROUND OF THE INVENTION

The process of manufacturing precision analog components, such as operational amplifiers, results in completed analog components with variable operating characteristics. This is generally due to normal variations in processes and materials used during manufacture.

Recently, in order to compensate for variations in the manufacture of analog components, manufacturers have provided fuses on the analog components. The fuses are connected to adjustable elements associated with analog devices on the analog component. The fuses may be selectively blown after manufacturing in order to adjust or "trim" certain operating characteristics of the analog component. In this regard, aspects of a manufactured analog component's operation may be measured and this measurement data may be used to determine which fuses to blow in order to trim the component so that it operates closer to predetermined specifications. Trimming is advantageous in many ways. For example, trimming allows manufacturers to offer analog components with greater accuracy and built in flexibility to optimize analog components for particular applications.

Conventionally, fuses on integrated circuit analog components have been implemented as segments of poly-silicon, metal or other material. These fuses are conventionally blown selectively, causing the fuse to create an open circuit, using a laser or by introducing a destructive electrical charge across the fuse through probe pads on the integrated circuit. Each of these techniques has several disadvantages.

First, blowing a fuse by laser or by destructive electrical charge applied to probe pads requires the fuses to be blown prior to packaging the integrated circuit. This is disadvantageous because the operating characteristics of the analog component, such as its offset voltage, may change as a result of the packaging process as well as the electrical characteristics of the package itself. Thus, trimming prior to packaging does not allow the manufacturer or anyone else to compensate for the effects of packaging on the analog component. Moreover, because most analog components are packaged prior to delivery to customers, it is generally not possible for customers to perform trimming.

Second, because blowing fuses in the conventional manner is destructive, it is not possible to undo the trimming process if desired. Additionally, blowing fuses may result in damaging passivation and other layers and structures on an integrated circuit. This damage may result in corrosion or other failure either immediately or over time.

Third, blown fuses may have conductive remnants which may migrate over time and reconnect leading to failure during operation in the field.

For the foregoing reasons, there is a need for a new technique for trimming analog components, and particularly those implemented as integrated circuits. There is a need to be able to perform the trimming either before or after packaging by the manufacturer, customer or third party if desired. There is a further need for trimming by a non-destructive process to avoid reliability problems and, in some instances, the irreversibility of destructive processes. There is still a further need for a trimming process which may be performed using a small number of input pins to the analog component.

SUMMARY OF THE INVENTION

According to the present invention, trimming of an operational amplifier is performed electrically using non-volatile fuses. The non-volatile fuses may be programmed electrically without destroying any passivation layers or other devices on the electronic component. In the case of an integrated circuit analog component, the trimming may be performed either at the wafer level or at the packaging level. Trimming at the packaging level permits the trimming to be performed to compensate for packaging induced variations. It also allows trimming to be performed by customers or other third parties on the packaged parts. Moreover, when implemented as erasable non-volatile fuses, the fuses may be programmed more than once. The trimming may be performed specifically to adjust the quiescent current or offset voltage of an operational amplifier.

According to one embodiment of the invention, an operational amplifier includes a pair of input pins and an output pin, analog devices and non-volatile fuses. The analog devices are coupled to the pair of input pins and the output pin. The analog devices are operative to amplify differences in signals on the pair of inputs and output an amplified difference signal. The analog devices include adjustable elements for adjusting an offset voltage of the operational amplifier. The non-volatile fuses are coupled to the adjustable processing elements and are electrically programmable to adjust the adjustable processing elements to alter the offset voltage.

The operational amplifier is typically implemented as an integrated circuit. The adjustable elements within the operational amplifier may include switches, each being connected in series with a load device. The non-volatile fuses may be controllably coupled to the switches to activate one or more of the load devices and to change the offset voltage. The operational amplifier may further include registers for storing fuse configuration data received from a data pin. A multiplexer may be coupled between outputs of the registers and outputs of the nonvolatile fuses, and inputs to the adjustable elements. The multiplexer is operable to provide configuration data from the registers to the adjustable elements during a calibration mode and from the non-volatile fuses to the adjustable elements after programming of the analog component.

A method of programming an operational amplifier according to an embodiment of the invention includes loading calibration data into the operational amplifier and measuring output signals from the operational amplifier when configured with the calibration data. The loading and measuring are repeated with different values for the calibration data until desired calibration data is determined. The non-volatile fuses are electrically programmed on the operational amplifier with the desired calibration data.

The method may further include verifying the proper programming of the non-volatile fuses and programming the non-volatile fuses with a fuse lock value at the end of the programming. The method may be used, for example, to trim the quiescent current or offset voltage of the operational amplifier.

In another embodiment of the invention, an operational amplifier, includes a pair of input pins and an output pin, analog devices and non-volatile fuses. The analog devices are operative to amplify differences in signals on the pair of inputs and output an amplified difference signal. The analog devices include adjustable elements for adjusting a quiescent current of the operational amplifier. The non-volatile fuses are coupled to the adjustable processing elements. The non-volatile fuses are electrically programmable to adjust the adjustable elements to alter the quiescent current. The adjustable elements may include a resistor stack and switches. The resistor stack is biased by a current derived from the quiescent current and has a plurality of tap points. Each switch is coupled at one end to a respective one of the tap points and is coupled at the other end to each other switch. The non-volatile fuses are controllably coupled to the switches to select one of the tap points. The other end of the switch is coupled to a bias amplifier which changes the quiescent current based on the selected tap point.

DETAILED DESCRIPTION

Figure 1:
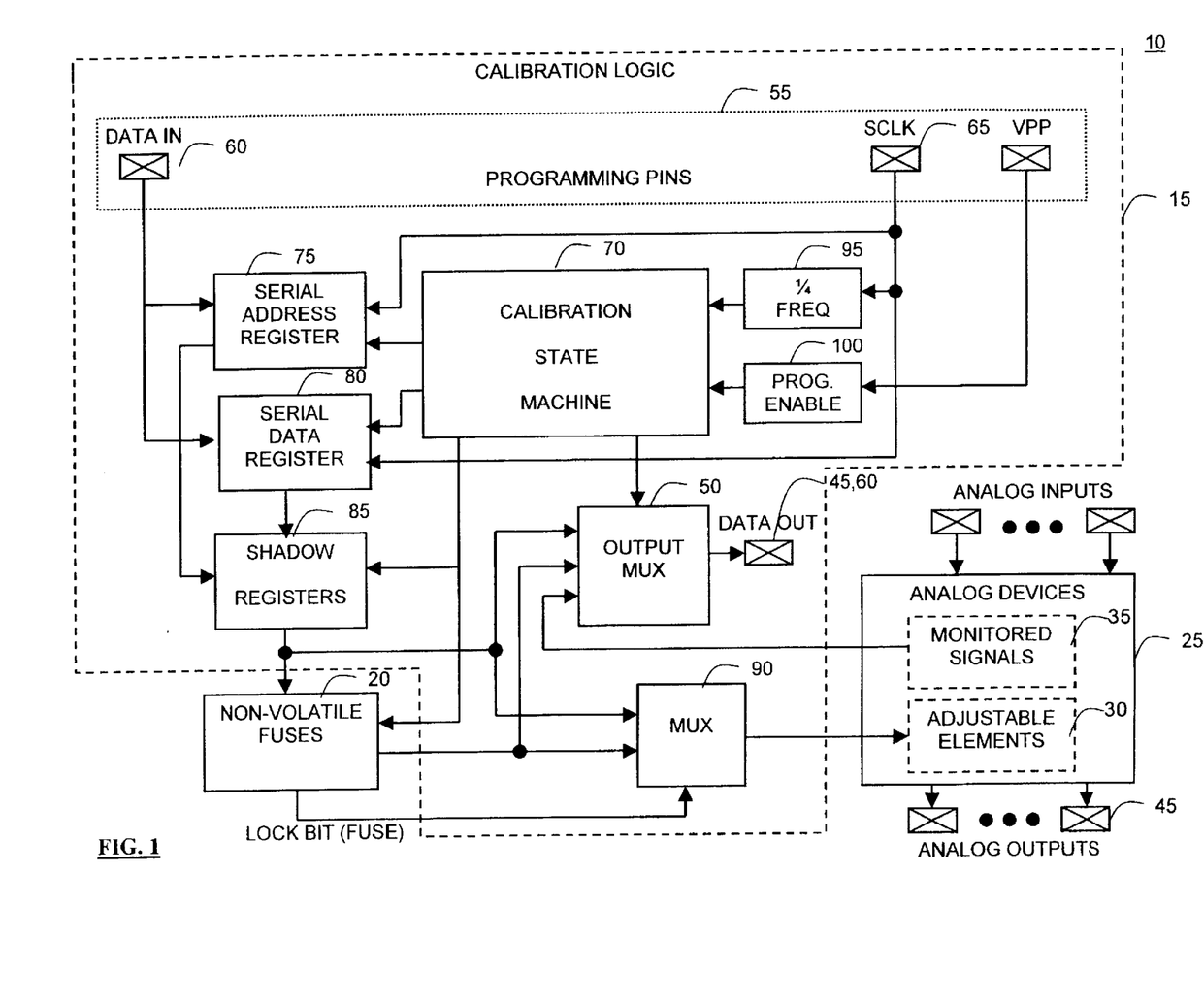
FIG. 1 depicts a functional block diagram of an analog electronic component including a programmable non-volatile fuse according to the present invention.

FIG. 1 depicts an embodiment of an analog electronic component 10 incorporating nonvolatile fuses according to an embodiment of the present invention. Referring to FIG. 1, the analog component 10 includes calibration logic 15, non-volatile fuses 20 and analog devices 25 see FIG. 1. The analog devices 25 receive input signals from input pins 40 of the analog electronic component, perform analog processing on the input signals, and output analog signals via the output pins 45. The analog devices also include adjustable elements 30 and monitored signals 35. The adjustable elements are programmable by the non-volatile fuses 20 in order to adjust the operation of associated analog devices within the analog devices 25. This permits the analog processing functions performed by the analog devices 25 to be adjusted or "trimmed" after manufacturing. The adjustments may be made to offset undesired variations in the analog devices that were introduced during manufacturing, to optimize the analog component for a particular application, to tighten manufacturing tolerances, to alter the specifications of the analog component or for any other reason.

To facilitate trimming the analog component, the analog devices may include monitored signals 35 which are output to an output pin 45, or one of the programming pins 55, via a control circuit such as the serial output multiplexer 50. The monitored signals are signals internal to the analog devices 25 which are not ordinarily output. However, the monitored signals 35 may be output during the process of trimming the analog component in order to facilitate proper programming of the non-volatile fuses.

The calibration logic 15 is used to facilitate placing an analog component into a trimming mode during which the non-volatile fuses 20 may be programmed to adjust the performance of the analog component. Three programming pins 55 are all of the pins that are required to program the analog component. The programming pins 55 may be multiplexed with the analog input and output pins 40 and 45 respectively or may be physically separate pins of the analog component 10. The data pin 60 provides a serial interface to external components and programming devices. The data pin 60 receives a data signal that is used to deliver calibration data to the analog component 10. The data pin 60 may also output monitored signals 35 during the calibration process. The SCLK clock pin 65 receives a clock signal input which is used to facilitate loading the calibration data onto the analog component and for controlling the programming mode. The VPP pin receives a programming voltage signal which is used to provide sufficiently high voltage to program the non-volatile fuses as well as to facilitate controlling the programming mode.

Referring to FIG. 1, the calibration logic includes a calibration state machine 70, registers 75–85 and multiplexers 50 and 90. The calibration state machine 70 has inputs coupled to the SCLK pin via a ¼ frequency divide unit 95 and to the VPP pin via a programming enable unit 100. The ¼ frequency divide unit 95 divides the clock signal into one quarter of its incoming frequency. This sets frequency of operation of the calibration state machine at one quarter of the clock signal.

The programming enable unit 100 detects when the voltage of the VPP signal rises above a predetermined threshold and, when this occurs, outputs a program mode signal to the calibration state machine 70 indicating the programming mode is active. The predetermined threshold is generally a voltage on the VPP pin which exceeds the voltage of power applied to the analog component by one or more transistor threshold voltages or by several volts. The programming enable unit 100 may include an inverter or other logic element coupled to the program pin that has a switching threshold set higher than the voltage level of the power source. Thus, the inverter never activates the programming mode signal unless the programing voltage signal is applied to the programming pin and the voltage of the programming signal exceeds the switching threshold. The programming voltage may be, for example, 13.5 volts. The power voltage for the device may be, for example, 3.3 or 5 volts. It will be understood, however, that any programming voltage (above or below 13.5 volts) or any power level for the component may be chosen consistent with the operating requirements of analog component 10.

The programming enable unit 100 may also generate control signals for multiplexers within the analog device which are not shown that are used to activate otherwise dormant signal paths to be used during the programming mode and to disable others.

Figure 2:
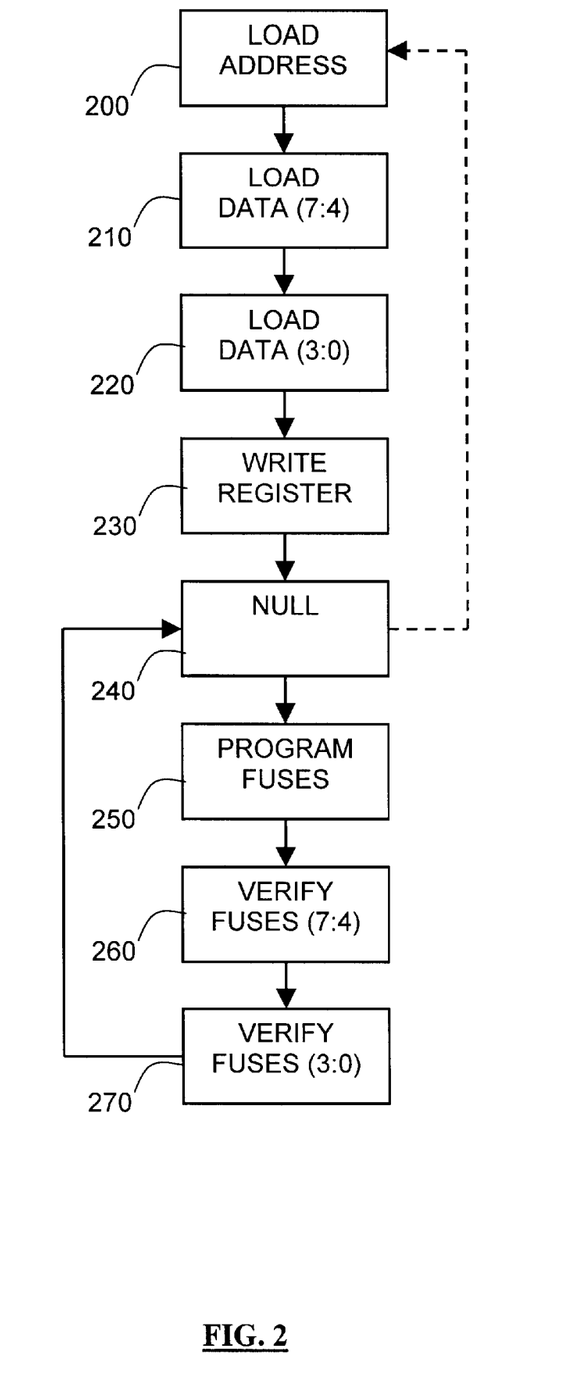
FIG. 2 depicts an embodiment of a method of trimming an analog component incorporating non-volatile fuses according to an embodiment of the present invention.

The calibration state machine outputs control signals to the registers 75–85, the output multiplexer 50 and the non-volatile fuses 20. The registers 75–85, the output multiplexer 50 are, in general, not functionally enabled during normal operation of the analog component 10. During programming of the analog device, however, the calibration state machine 70 selectively activates or enables the registers, the non-volatile memory and the multiplexer 50 for the programming and monitoring functions that comprise the trimming process. Alternatively, the registers may activate the multiplexer 50. A flow diagram of the programming process and states is shown in FIG. 2 and described in the accompanying description.

To initiate the trimming process, the programming voltage signal is raised to the programming voltage level. The clock and data signals may also be held at logic zero during the transition in the programming voltage signal. This causes the program enable unit 100 and logic in the calibration state machine 70 to detect the programming mode and output appropriate control signals to control the programming process.

The calibration state machine 70 receives the ¼ frequency clock signal 95 and the programming voltage signal and selectively activates the registers based on these signals. In a preferred embodiment of serial programming, the calibration state machine recognizes that the first two or four pulses of the clock signal are for storing addresses in the serial address register and that following eight clock pulses are for storing data into the serial data register.

Each data bit enters one side of the serial register and proceeds sequentially with each clock pulse along the serial register until clock pulses cease to be applied to the shift register. The clock pulses are selectively routed to the serial registers by the calibration state machine 70. In this manner, the serial registers may be filled from a serial data stream.

The serial address register may include any convenient number of bits and in general the number of bits is related to the number of non-volatile fuses on the analog component. However, in a preferred embodiment of the invention the serial address register stores two or four bits of address data. The serial data register may also include any convenient number of bits. In a preferred embodiment of the invention the number of bits is 8. The serial data register and the address register have outputs coupled to shadow registers 85.

The shadow register is used during the trimming process to store temporary calibration data that are changed during the trimming process to test the analog devices 25 on the analog component 10. The resulting tests are used to determine appropriate calibration data that is ultimately programmed into the non-volatile fuses 20. The programming of the non-volatile fuses is conducted under control of the calibration state machine and is performed at elevated voltage levels derived from the programming voltage signal from the VPP pin. The calibration data may be written into the non-volatile memory from the shadow register 85 or from the serial data register 80. The shadow register includes at least the same number of bits as the non-volatile fuses 20. The serial address register 75 and the serial data register 80 output address and data signals to the shadow register 85 under control of the calibration state machine to load the calibration data into the shadow register. The non-volatile memory may be configured into addressable blocks of, for example, 8 bits. Any convenient width may be used and the serial address and data registers, in general, are chosen to match the size and addressable organization of the non-volatile memory. The non-volatile memory technology may be EPROM, EEPROM, flush, UV erasable EPROM or any other electrically programmable, non-volatile memory. The calibration data may be programmed and reprogrammed into the non-volatile memory when erasable non-volatile technology is implemented.

When the calibration data is loaded into the shadow register, it is applied to adjustable elements 30 within the analog devices 25 through a multiplexer 90. The multiplexer 90 selectively applies either calibration data from the shadow register or calibration data from the non-volatile fuses to the adjustable elements. The multiplexer 90 is controlled by a lock-bit which is programmed into a non-volatile fuse at the end of the programming process indicating that the non-volatile fuses have been programmed. The lock bit is not coupled to adjustable elements within the analog component. Rather it is coupled to the multiplexer 90. Prior to the lock bit being set, calibration data for the adjustable elements is provided through the shadow register. After this point, calibration data is provided to the adjustable elements through the nonvolatile fuses.

Programming equipment used in trimming the analog component may store calibration data into the shadow register during programming and read out monitored signals 35. Based on values of the monitored signals received by the programming equipment, the programming equipment may store new calibration data into the shadow registers and take another reading of the monitored signals 35. Based on these and possibly additional iterations, the programming equipment determines final calibration values. The final calibration values are stored in the nonvolatile fuses 20. During this process, the calibration state machine may route the appropriate monitored signals 35 to the appropriate data output pin 45 or 60 based on the address of the calibration data, a location within a programming sequence or other information.

FIG. 2 depicts a state diagram of the calibration state machine. It also will be used to describe the method of trimming an analog component 10 according to an embodiment of the present invention. Referring to FIG. 2, in step 200, programming equipment and the calibration state machine load address data into the serial address register 75. The address data may include up to four bits of data. If the address data includes less than four bits, the programming equipment must insure that edges of the data signal and clock signal are properly applied to the analog component 10. It will be understood that more than four address bits may be applied under many scenarios, including when the clock frequency is divided more than four times, when multiple address load cycles are implemented and any other convenient scenario.

In steps 210 and 220, the programming equipment and the calibration state machine load eight bits of data, four bits at a time, into the serial data register. Similarly to the address data, number of data bits loaded at a time and the total number of data bits loaded in steps 210 and 220 may change based on the number of times that the clock frequency is divided, the number of data load cycles and any other convenient metric.

In step 230, the programming equipment and the calibration state machine writes calibration data from the serial data register into the shadow register at the address specified by the serial address register. Step 230 causes the adjustable elements within the analog devices 25 to become configured by the calibration data. Then in step 240, the state machine has a null state in which it is not active. The programming equipment may use this null state to apply test signals to the analog component and measure output signals from the analog component. The output signals may include monitored signals from the analog devices 25 that are not normally output, such as quiescent current, as well as signals which are output by the analog component during normal operation of the component.

Based on the measurements taken by the programming equipment and functional specifications for the analog component, the programming equipment may change the calibration data and cause step 100 to begin again with the changed calibration data. In this manner, the programming equipment may iteratively apply calibration data to an analog component and test the response of the analog component in order to determine the best calibration data for that particular analog component given its particular variations from specification.

In step 250, the programming equipment and the calibration state machine cause the non-volatile fuses to be programmed. Then in steps 260 and 270, the programming equipment verifies the programming of the fuses. After step 270, step 240 begins again and the programming equipment measures the effectiveness of the programming. If the programming was effective, the programming equipment either completes the trimming cycle or causes step 250 to begin again in order to program additional fuses. If the programming was not effective, then step 250 begins again to repeat the programming process a reasonable number of times.

Trimming an Operational Amplifier

Figure 3:
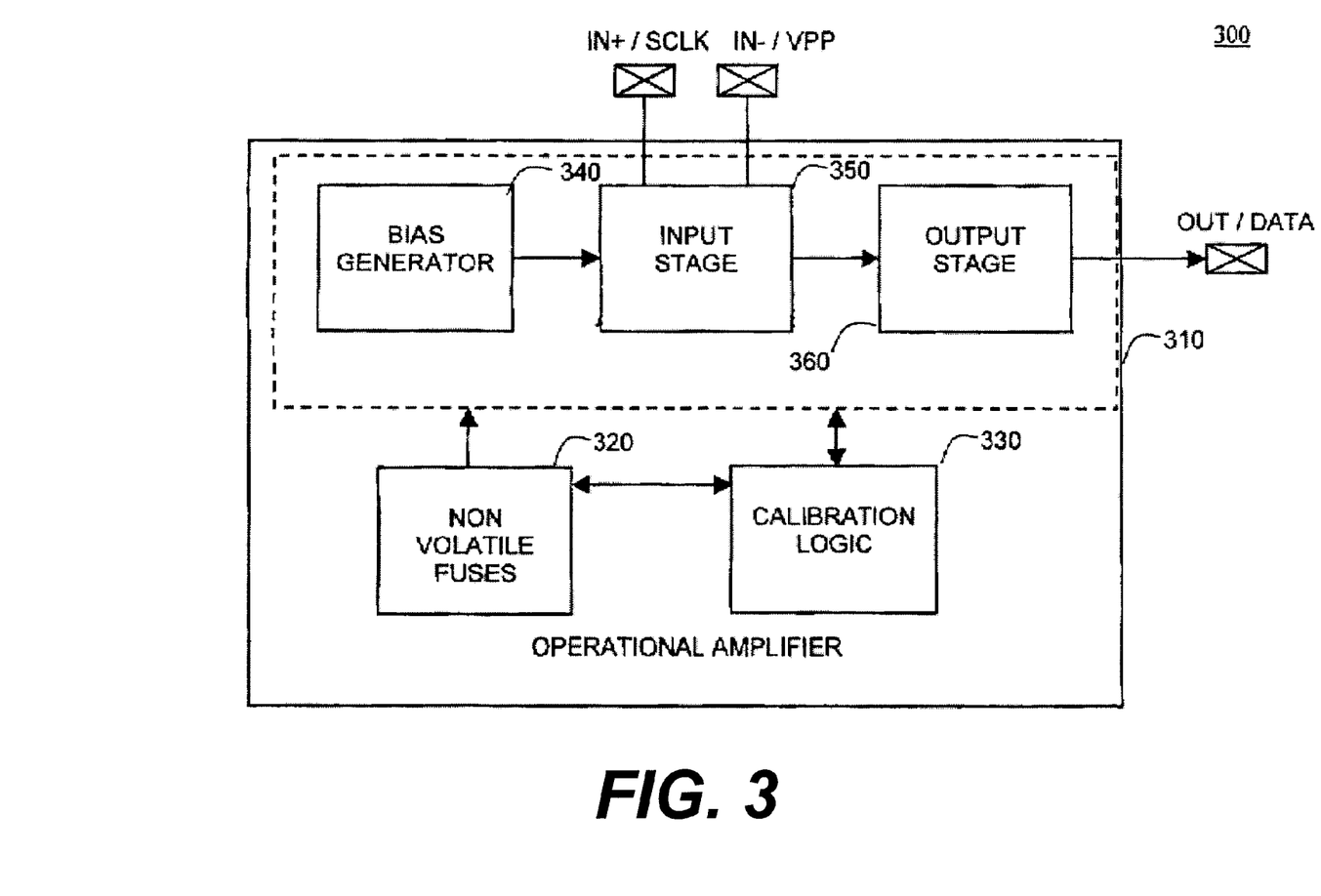
FIG. 3 depicts an embodiment of an operational amplifier according to the present invention.

FIG. 3 depicts a block diagram of an embodiment of an operational amplifier 300 according to the present invention. Referring to FIG. 3, the operational amplifier includes analog devices 310, non-volatile fuses 320 and calibration logic 330. The calibration logic 330 and the non-volatile fuses 320 may be coupled together and to the analog devices 310 in the same manner at depicted in FIG. 1. The analog devices 310 further include a bias generator 340, an input stage 350 and an output stage 360. The bias generator generates a quiescent current which is used to derive bias voltages for analog devices, such as N and P type field effect or bipolar transistors, in the input and output stages. The input stage 350 receives inputs from the positive and negative terminals of the operational amplifier 300. In response, the input stage amplifies differences between the positive and negative terminals and outputs the differences to the output stage 350 where they are further amplified. The calibration logic 330 and the non-volatile fuses 320 may be used to trim certain aspects of the performance of the operational amplifier, such as the quiescent current associated with the bias generator and the offset voltage associated with the input stage. These techniques are discussed below.

An advantage of the present invention is that programming of the non-volatile fuses can be performed using only three pins during programming; SCLK, VPP and DATA. A further advantage is that these pins can be the same pins that are implemented as input/output pins of the analog component during its normal operation.

FIG. 3 depicts a preferred implementation of the SCLK, VPP and DATA pins illustrating that these pins are multiplexed with the IN+, IN− and OUT pins of an operational amplifier. Thus, a 5 pin operational amplifier, which uses two pins for power and ground, may implement trimming through a three pin programming interface (SCLK, VPP and DATA). It is also possible to program analog components through the three pin programming interface while the components are implemented within a system in a process called in-line serial programming.

Trimming the Quiescent Current of an Operational Amplifier

Figure 4:
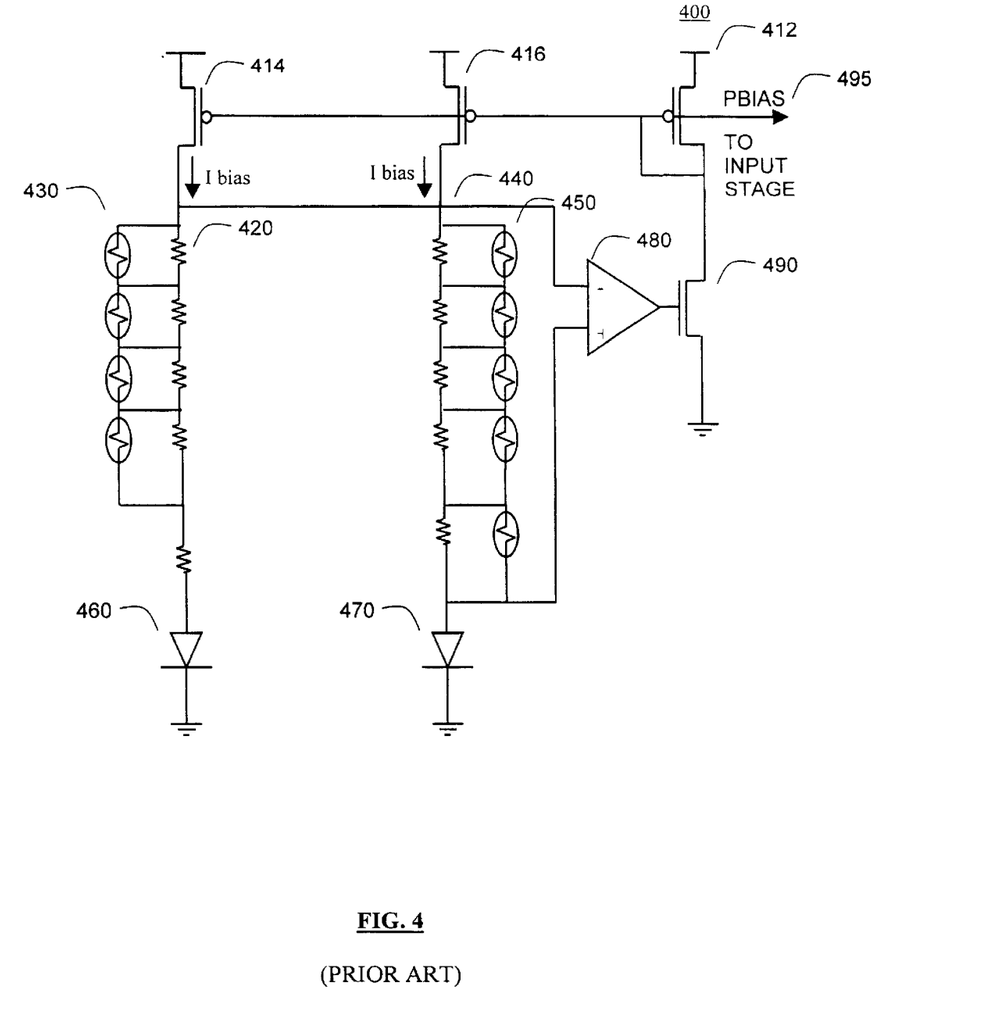
FIG. 4 depicts a circuit for trimming quiescent current in an op amp with blowable fuses according to the prior art.

FIG. 4 depicts a technique incorporating laser or polysilicon fuses according to the prior art for establishing a quiescent current in a bias generator. Referring to FIG. 4, the quiescent current generator according to the prior art includes three P-type transistors 410 connected in a current mirror configuration. All three P-type transistors are have their sources connected to the power supply. Transistor 412 has its gate connected to its drain and its drain connected to an N-type transistor 490. The gate of transistor 412 also has its gate connected to the gates of the other P-type transistors 414 and 416. Transistors 414 and 416 have the same length and width dimensions and therefore generate bias currents $I_{BIAS1}$ and $I_{BIAS2}$ that are the same.

The drains of transistors 414 and 416 are respectively connected to the top of the resistor stacks 420 and 440 as shown. Associated with each resistor stack 420 is a polysilicon or laser fuse stack 430. Each resistor in the resistor stack 420 is connected in parallel to a corresponding one of the fuses 430. The last resistor in the bottom of the resistor stack 420 is not connected in parallel with a corresponding fuse and is connected in series with a diode 460 as shown.

All of the fuses are initially short circuited. Therefore, the resistance between the P-type transistor 414 and the diode 460 is initially set at the value R1 of the bottom resistor. The resistance may be increased by blowing fuses in the fuse stack 430.

The resistor stack 440 and the corresponding fuse stack 450 operate in the same manner as the resistor and fuse stacks 420 and 430. However, the bottom resistor of the resistor stack 440 also includes a fuse connected in parallel to it and is connected to the diode 470. The diode 460 has an area that is a larger than the area of the diode 470.

A bias operational amplifier 480 has positive and negative terminals as shown. Its negative terminal is connected to the top of the resistor stack 420 and its positive terminal is connected to the bottom of the resistor stack 440. The operational amplifier 480 amplifies differences between the voltages on its inputs and outputs a difference signal to the gate of the N-type transistor 490. The N-type transistor has its source connected to ground and its drain connected to the drain and gate of the P-type transistor 412. In this manner, the quiescent current is set through the feed back loops associated with the resistor stacks 420 and 440 and diodes 460 and 470. Fuses may be blown to selectively increase resistance in one stack vs. the other stack in order to optimize the quiescent current.

While the quiescent current trimming technique shown in FIG. 4 works, it is a destructive process with numerous disadvantages. The disadvantages include expense associated with purchasing a laser trimming device, the requirement of having to trim the device prior to packaging, and damage from the process of blowing the fuses to name a few.

Figure 5:
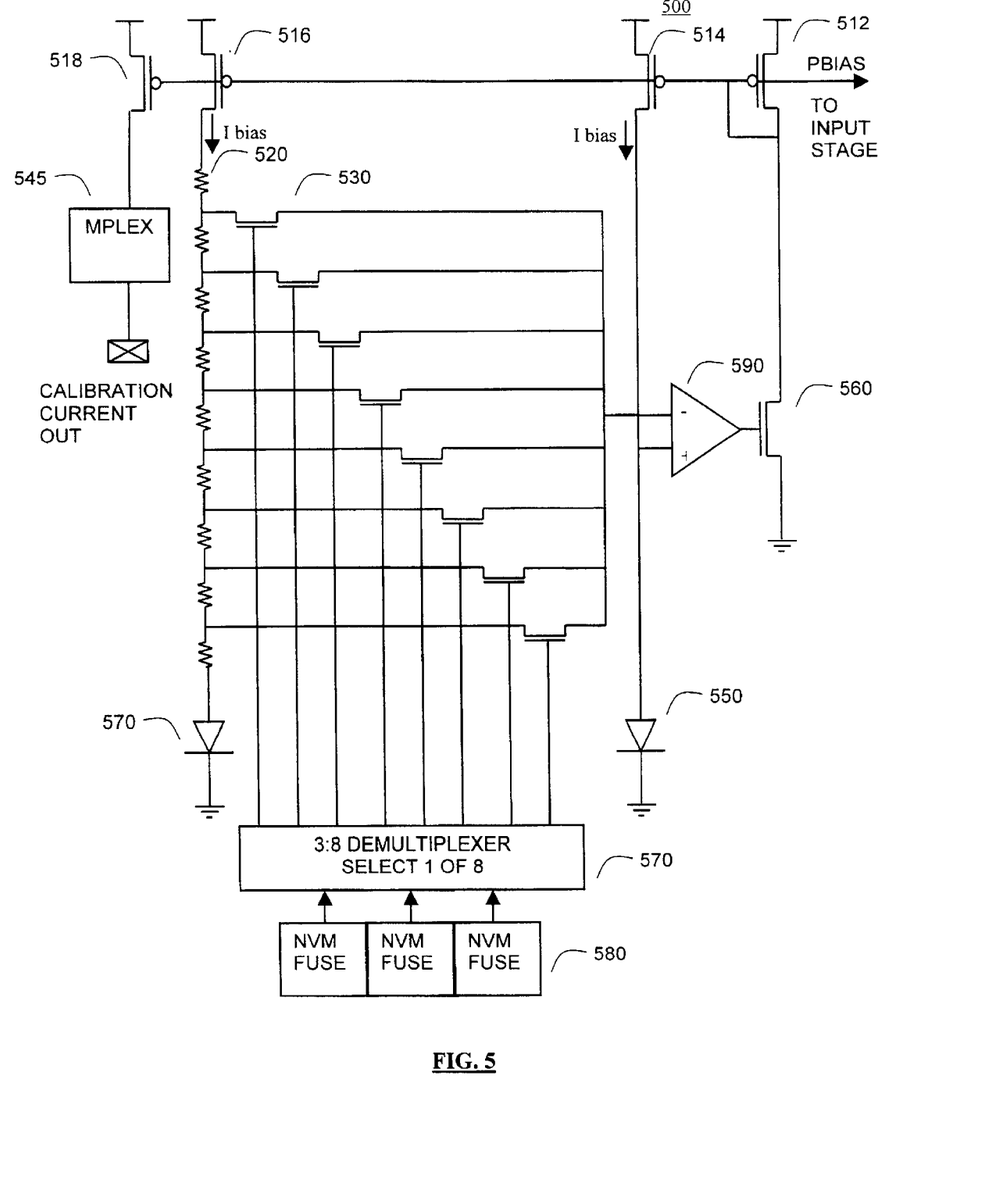
FIG. 5 depicts an embodiment of adjustable elements and associated analog devices for trimming quiescent current according to an embodiment of the present invention.

FIG. 5 depicts an arrangement 500 for trimming the quiescent current in a bias generator using non-volatile fuses according to an embodiment of the present invention. Referring to FIG. 5, four P-type transistors 512, 514, 516 and 518 are coupled in a current mirror configuration to a power voltage. The transistor 512 has its gate and drain connected in a diode configuration to the drain of an N-type transistor 560. The transistor 512 has its gate connected to the transistors 514–518 and therefore mirrors its current to these transistors. Transistor 514 has its drain coupled to a diode 550. The transistor 516 has its drain coupled to a resistor stack 520. Rather than having fuses connected in parallel to each resistor in the resistor stack as shown in the prior art, the fuse implementation according to the present invention is different. Transistor 518 has its drain coupled to a multiplexer 545. The multiplexer may receive several inputs. However, during trimming of the quiescent current, the multiplexer is operative to steer the quiescent current from the P-type transistor 518 to an output pad for measurement by a programming system.

According to an embodiment of the present invention, the resistor stack 520 includes a plurality of tap points between series connected resistors. Each tap point is connected across a switch, such as an N or P type transistor, to the negative terminal of an operational amplifier 590. Only one switch 530 is active at a given time and therefore only one tap point within the resistive stack delivers its voltage to the negative terminal of the operational amplifier 590.

In order to trim the operational amplifier, the switches 530 may be selectively and individually turned on and off to test the effect on the quiescent current which may be diverted to an output pad via the multiplexer 545. When an appropriate value is determined this may be programmed into the non-volatile fuses 580 as described with reference to FIGS. 1 and 2.

In order to selectively activate the switches 530, a 3:8 demultiplexer 570 is used to apply a control signal to activate one switch 420 at a time. Any convenient size demultiplexer may be used depending on the number of resistors and switches implemented. The demultiplexer is advantageous in that it permits the use of fewer fuses than would otherwise be required.

Three non-volatile fuses 580 are coupled to the 3:8 demultiplexer. The non-volatile fuses may be programmed electrically with calibration data which sets which of the switches to activate. The three fuses are sufficient to generate the eight combinations of switch activation. Although not shown, a shadow register may also be coupled to the 3:8 demultiplexer 570 in order to test different calibration data during the trimming process. Once the calibration data has been determined based on measurements made with different calibration data implemented through the shadow registers, the final calibration data may be programmed into the non-volatile fuses.

The operational amplifier 590 has its negative terminal connected to the output of the switches 530 and its positive terminal connected to the drain of transistor 514. The area of diode 540 is greater than the area of the diode 550. The amplifier amplifies the difference in its input voltages and outputs the difference to the gate of the N type transistor 560. The N type transistor 560 has its source coupled to a ground voltage and its drain coupled to the gate and drain of the P-type transistor 512. The N-type transistor biases the P-type transistor 512 of the current mirror based on the feed back loops which include the diodes 540 and 550.

Trimming the Offset Voltage of an Operational Amplifier

Offset voltage in an operational amplifier is an undesirable characteristic. It generally occurs in the input stage and results in the operational amplifier determining a difference in input voltage signal, and outputting the amplified difference, when the inputs to the operational amplifiers are at equal voltages. In order to trim manufactured operational amplifiers to attempt to eliminate this problem, the scheme depicted in FIG. 6 has conventionally been implemented according to the prior art.

Figure 6:
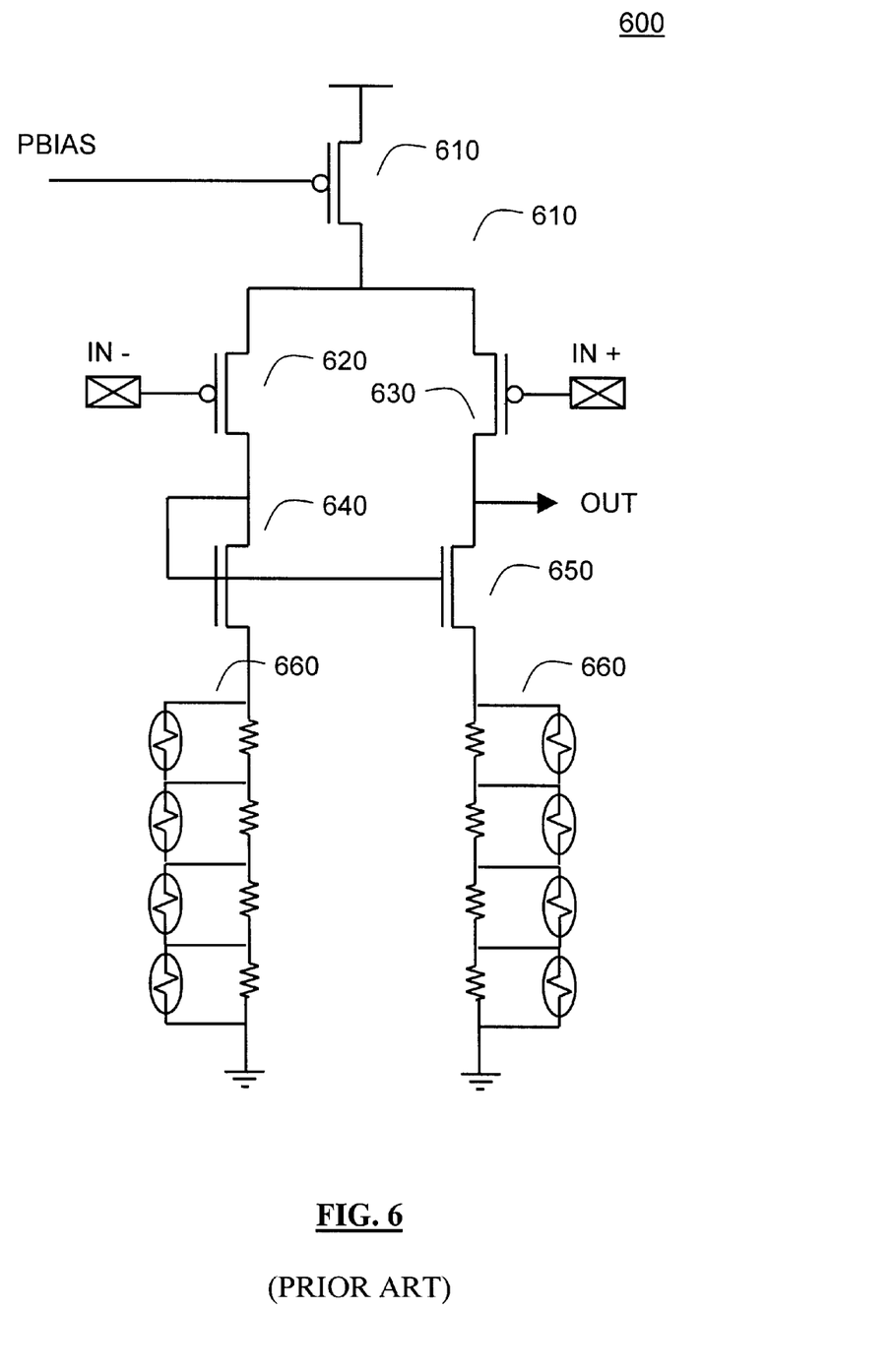
FIG. 6 depicts a circuit for trimming offset voltage according to the prior art.

Referring to FIG. 6, the conventional input stage includes a P type transistor biased with a voltage signal to produce a quiescent current into the sources of a differential pair of P-type transistors 620 and 630. Transistor 620 has its gate connected to the negative input terminal of the operational amplifier and transistor 630 has its gate connected to the positive terminal of the operational amplifier. The drain of transistor 620 is connected to the diode connected N type transistor 640. The transistor 640 has its drain and gate connected together. The gate of transistor 640 is connected to the gate of transistor 650 and biases it. Transistor 650 has its drain connected to the drain of transistor 630 and at this connection provides the difference signal to the output stage.

Transistors 640 and 650 together are load devices. They each have their sources connected to resistor stacks with associated laser trimmable or polysilicon fuses wired in parallel with the resistors as shown.

Offset voltage is generally introduced into an input stage when either the differential pair or the load transistors do not match each other. In order to correct this, the resistor and laser fuse stack 660 of the prior art allows the addition of resistance to one leg or the other of the differential pair to compensate for differences. This technique has several disadvantages. It has all of the disadvantages associated with having to blow a fuse described above. It also is disadvantageous because adding resistance to one leg does not eliminate differences between the legs of the differential pair because the current/voltage characteristics of a resistor are different than the current/voltage characteristics of transistors.

Figure 7:
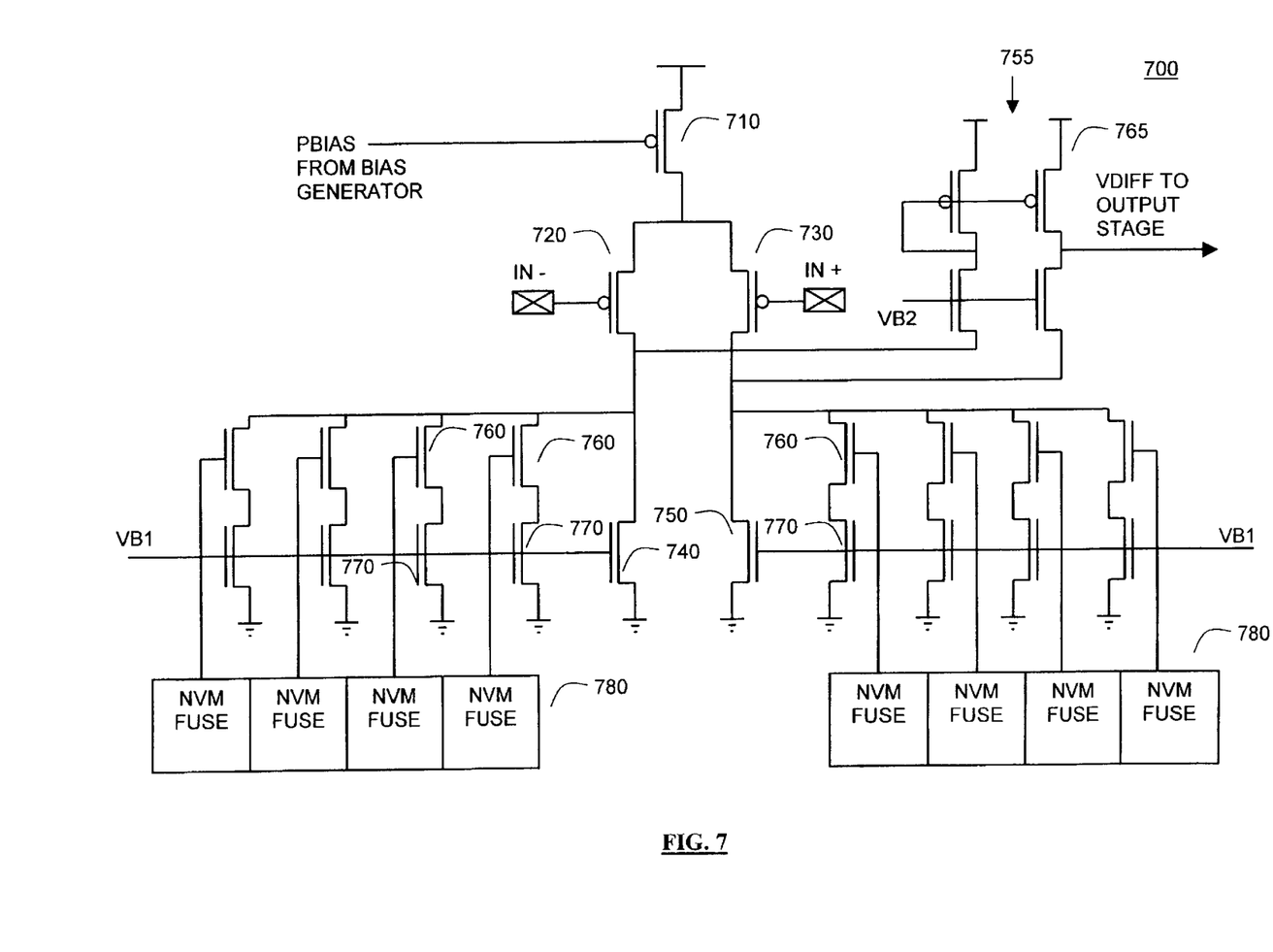
FIG. 7 depicts an embodiment of adjustable elements and associated analog devices for trimming offset voltage according to an embodiment of the present invention.

FIG. 7 depicts a method of trimming an input stage of an operational amplifier in order to reduce offset voltage according to an embodiment of the present invention. According to this embodiment, non-volatile fuses are implemented instead of laser fuses and transistors are implemented as adjustable elements rather than resistors to balance the legs.

Referring to FIG. 7, the conventional input stage includes a P type transistor biased with a voltage signal to produce a quiescent current into the sources of a differential pair of P-type transistors 720 and 730. Transistor 720 has its gate connected to the negative input terminal of the operational amplifier and transistor 730 has its gate connected to the positive terminal of the operational amplifier. The drain of the transistor 720 is connected to drain of the N type transistor 740. The transistor 740 has its gate biased by a signal VB1, which may be derived by the bias generator from the quiescent current in any well known manner. The gate of transistor 750 is also connected to signal VB1. Transistor 750 has its drain connected to the drain of transistor 730. The output of the input stage, the difference signal may be taken from the connection between transistors 750 and 730. Alternatively, as shown, a cascode configuration may be used in which the cascode load 755 is coupled to the drains of the differential pair as shown. The cascode devices may receive a bias signal, such as VB2, from the bias generator. In the cascode configuration, the difference signal output to the output stage of the operational amplifier may be taken from the drain of transistor 765.

In order to compensate for differences in the legs of the input stage shown in FIG. 6, according to an embodiment of the present invention, the adjustable elements 760 and 770 are introduced. The adjustable elements are selectively connected to the drains of the differential pair by the non-volatile fuses 780 based on the configuration data stored in the non-volatile fuses. The adjustable elements include a switch element 760 and a load element 770. The switch element 760 may be a transistor as shown with its source connected to the drain of one element of the differential pair, its gate coupled to a non-volatile fuse (or decoder coupled to a non-volatile fuse), and its drain connected to the source of a load element 770. The load element 770 may be viewed as providing additional width for the corresponding load transistor 740 or 750.

In order to ensure proper matching between the load elements 770 and the corresponding load transistor 740 or 750, the load elements 770 may be physically positioned on an integrated circuit in close proximity to the corresponding load transistor 740 or 750. When one or more of the switches 760 is enabled by either a non-volatile fuse 780 or a shadow register, current is diverted from the drain of the corresponding P type transistor to the load transistors 770 corresponding to the enabled switches 760. By selectively enabling the appropriate switches by storing the appropriate calibration data in the non-volatile fuses, differences between the load transistors or the differential pair which may have introduced an offset voltage in the input stage may be compensated for during trimming. The technique of introducing additional load transistors through trimming is more effective than the prior art technique of implementing resistors because the transistors more closely match the existing characteristics of the input stage. Moreover, use of the shadow registers allows experimentation with different calibration data to determine the optimum calibration for programming the non-volatile fuses.

The technique shown in FIG. 7 is merely illustrative of the techniques for adjusting the offset voltage. For example, in addition to including adjustable elements 760 and 770 in parallel with the load devices 740 and 750, adjustable elements may also be added in parallel with the differential pair. In the embodiment shown in FIG. 7, the adjustable elements added to the differential pair would be P type transistors. In another variation, adjustable elements may only be added to the differential pair as described above.

In still another variation, the load devices may be P type transistors, not N type transistors. N type transistors may implement the differential pair. In this embodiment, the adjustable elements 760 and 770 may be added to either or both of the differential pair or the load device as described above.

Figure 8:
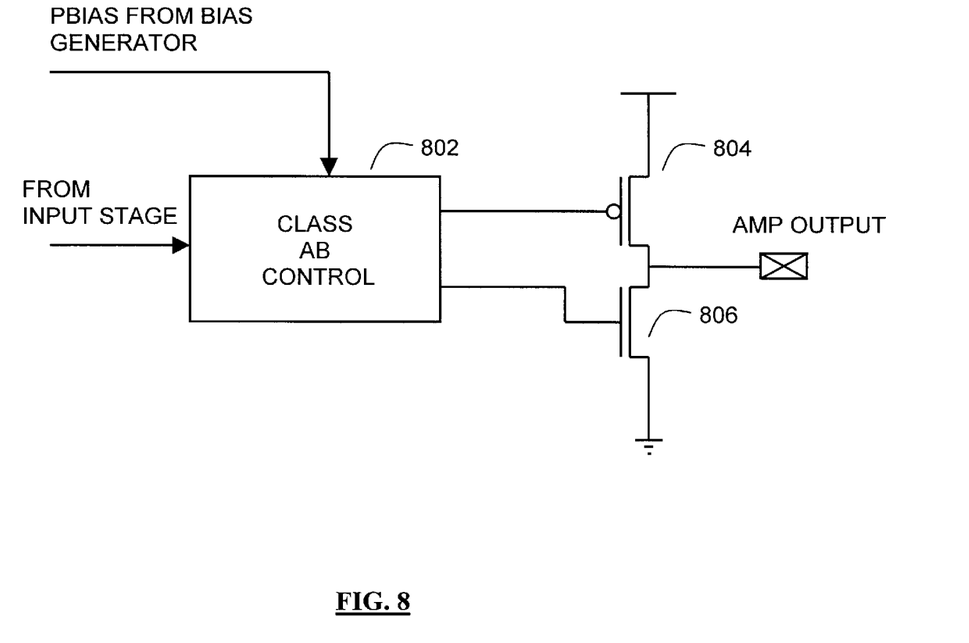
FIG. 8 depicts an output stage of an operational amplifier.

FIG. 8 depicts a conventional output stage 800 that may be used according to the present invention. The output stage receives as inputs one or more bias signals from the bias generator and the difference signal generated by the input stage. These input signals are input to a class AB control unit which generates signals for driving the gates of output transistors 804 and 806. The output transistors 804 and 806 are P and N type transistors, respectively. The transistor 804 has its source coupled to power and the transistor 806 has its source coupled to ground. The drains of the transistor 804 and 806 are coupled together and produce the output signal of the operational amplifier.

Non-Volatile Fuse Implementation

Figure 9:
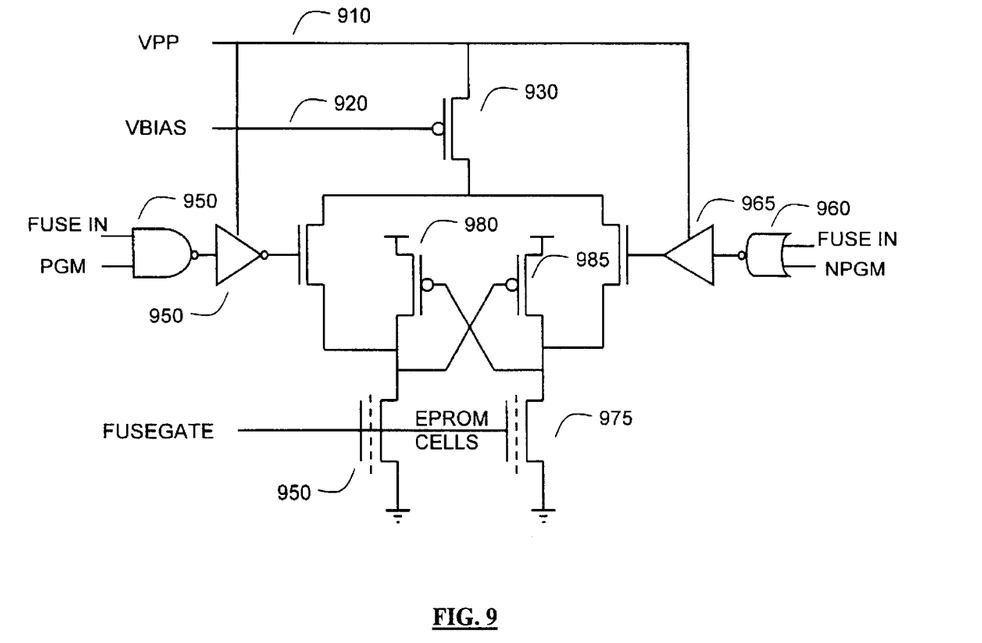
FIG. 9 depicts a preferred non-volatile fuse according to an embodiment of the invention.

FIG. 9 depicts a new non-volatile, currentless fuse 900 according to an embodiment of the present invention. The currentless fuse 900 does not draw significant current in either the programmed or unprogrammed state. It uses two EPROM transistors arranged in a cross-coupled fashion to implement each fuse, rather than a single EPROM transistor.

Referring to FIG. 9, the fuse 900 includes a p-type transistor 930 with its gate connected to VBIAS and its source connected to a programming voltage VPP. The fuse 900 further includes two n-type transistors 940 and 945, two EPROM transistors 970 and 975 and two p-type transistors 980 and 985.

On one side of the cross-coupled EPROM fuse, a two input NAND gate 950 has its output connected to an inverter and level-shifter 955 which in turn has its output connected to the gate of the transistor 940. The drain of the transistor 940 is connected to the drain of transistor 930 and the source of transistor 940 is connected to the drain of the EPROM transistor 970. The 2 input NAND gate 950 has its inputs connected to a FUSEIN signal and a program signal PGM.

The EPROM transistor 970 has its drain connected to the source of transistor 940, its gate connected to a FUSEGATE voltage, and its source connected to ground.

On the other side of the cross-coupled EPROM fuse, a two input NOR gate 960 has its output connected to a non-inverting level shifter 965 which in turn has its output connected to the gate of the transistor 945. The drain of the transistor 945 is connected to the drain of transistor 930 and the source of transistor 945 is connected to the drain of the EPROM transistor 975. The 2 input NOR gate 960 has its inputs connected to the FUSEIN signal and a negative program signal NPGM. The NPGM and PGM signals are inverted with respect to each other. The EPROM transistor 975 has its drain connected to the source of transistor 945, its gate connected to a FUSEGATE voltage, and its source connected to ground.

In order to program either of the two EPROM cells of the currentless fuse, VPP and FUSEGATE must assume programming voltage levels, typically 10–15V and VBIAS is set at a level between VPP and ground to ensure that transistor 930 is activated and produces sufficient current and voltage across the respective EPROM transistor 970 or 975 to be programmed. When both the gate and drain of the EPROM transistor 970 or 975 are at the programming (high) voltages, electrons from the channel of the EPROM transistor 970 or 975 become "hot." These hot electrons tunnel through a gate oxide which separates the channel from the gate of the EPROM transistor 970 or 975. The gate accumulates electrons in this manner during programming which tends to raise the threshold voltage necessary to turn the EPROM transistor on. Programming is completed when the threshold voltage of the EPROM transistor 970 or 975 is raised to a level greater than the power supply to be applied to the electronic device during normal operation.

The signals PGM and NPGM always carry opposite logic states. These signals may be used to program a bank of fuses within an array of fuses for simultaneous programming. each fuse has a separate, independent FUSEIN signal for determining which of the two EPROM transistors 970 or 975 to program during the programming operation. In order to program EPROM transistor 970, both PGM and FUSEIN must be high, and the output of the level-shifter 955 is a high voltage turning on transistor 940 and allowing the programming current to pass form VPP through transistors 930, 940 and 970. Conversely, transistor 945 is off because the output of the level-shifter 965 is low.

Similarly, in order to program EPROM transistor 975, both NPGM and FUSEIN must be low. The output of the level-shifter 965 is a high voltage signal which turns on transistor 945 allowing the programming current to pass from VPP through transistors 930, 945 and 975. Conversely, transistor 955 is off because the output of the level-shifter 955 is low.

Once the currentless fuse 900 has been programmed, the FUSEGATE signal is held at the power supply voltage. The EPROM transistor which was programmed has accumulated electrons and has a threshold voltage greater than the FUSEGATE voltage. Therefore, it remains in the "OFF" state. The unprogrammed EPROM transistor has not accumulated electrons and has a threshold voltage less than the FUSEGATE potential. It remains in the ON state.

During normal operation after programming, the gates of transistors 940 and 945 are driven to low voltage. These transistors are therefore turned off. The fuse operation is therefore controlled by the cross coupled non-volatile EPROM transistors 970 and 975. Programming results in only one of the two EPROM transistors being programmed.

Each EPROM transistor has its source coupled to ground, its gate coupled to a fuse gate voltage and its drain connected to a drain of a corresponding one of the p-type transistors 980 and 985. Transistors 980 and 985 have their sources coupled to the power supply and their gates connected to the drain-drain interface of the opposing side of the cross-couple.

For example, when the EPROM transistor 970 is programmed, it is turned OFF and does not conduct electrical current. Therefore, its drain voltage, which is also the fuse output signal, rises to a high voltage level at the urging of the transistor 980. The voltage at the drain of EPROM transistor 970 is applied to the gate of the p-type transistor 985. This turns OFF the p-type transistor 985. The EPROM transistor 975 is in an ON state because it was not programmed. Therefore, its drain node is at a low voltage level, however it does not conduct any current.

Neither leg of the cross coupled fuse conducts current when one fuse is programmed. When both fuses are unprogrammed, the currentless fuse does conduct current. However, this condition is rectified by the programming process. Both fuses should never be programmed at the same time. The output signal from the cross-coupled EPROM transistors is applied to the adjustable elements within the electronic component as discussed above.

When power is applied to an electronic component which includes the currentless fuse, DC current flows through the leg of the unprogrammed EPROM transistor and not through the leg of the programmed EPROM transistor. The cross-coupled transistors in the currentless fuse then cause the fuse to reach a steady state in which virtually no current, other than leakage current, flows through either EPROM transistor. In this manner, the currentless fuse reaches the proper steady state without requiring any initializing circuitry.

While specific embodiments of the invention have been shown and described, it will be understood by those having ordinary skill in the art that changes may be made to those embodiments without departing from the spirit and scope of the invention.

What is claimed is:

1. An operational amplifier, comprising:
    a pair of input pins and an output pin;
    analog devices coupled to the pair of input pins and the output pin, the analog devices being operative to amplify differences in signals on the pair of inputs and output an amplified difference signal, the analog devices including adjustable elements for adjusting an offset voltage of the operational amplifier; and
    non-volatile fuses coupled to the adjustable processing elements, the non-volatile fuses being electrically programmable to adjust the adjustable processing elements to alter the offset voltage;
    wherein a quiescent current and the offset voltage are independently adjustable.

2. The operational amplifier according to claim 1, wherein the operational amplifier is an integrated circuit.

3. The operational amplifier according to claim 2, wherein the adjustable elements include:
    a plurality of switches, each being connected in series with a load device;
    wherein the non-volatile fuses are controllably coupled to the switches to activate one or more of the load devices and change the offset voltage.

4. The operational amplifier according to claim 2, further comparing:
    registers coupled to at least one of the input pins, the registers storing fuse configuration data received from a data pin.

5. The operational amplifier according to claim 4, further comprising:
    a multiplexer coupled between outputs of the registers and outputs of the non-volatile fuses, and inputs to the adjustable elements;
    wherein the multiplexer is operable to provide configuration data from the registers to the adjustable elements during a calibration mode and from the non-volatile fuses to the adjustable elements after programming of the analog component.

6. The operational amplifier according to claim 5, wherein the registers include serial registers for receiving the configuration data serially through the data pin.

7. The operational amplifier according to claim 6, wherein the data pin, a single clock pin and a single programming voltage pin of the operational amplifier are collectively operable to program the non-volatile fuses.

8. The operational amplifier according to claim 7, wherein at least one of the single data pin, the single clock pin and the single programming voltage pin is also usable as an analog input pin during normal operation.

9. The operational amplifier according to claim 5, wherein the configuration data includes fuse lock data that sets the multiplexer to route outputs of the non-volatile fuses to the adjustable elements.

10. A method of programming an operational amplifier, comprising:
    loading calibration data into the operational amplifier;
    measuring output signals from the operational amplifier when configured with the calibration data;
    repeating the loading and measuring with different values for the calibration data until desired calibration data is determined; and
    electrically programming non-volatile fuses on the operational amplifier with the desired calibration data.

11. The method of programming according to claim 10, further comprising:
    verifying the proper programming of the non-volatile fuses.

12. The method of programming according to claim 10, further comprising:
    programming the non-volatile fuses with a fuse lock value at the end of the programming.

13. The method according to claim 10, wherein the loading is performed serially through a data pin on the operational amplifier.

14. The method according to claim 13, wherein the data pin is used as an analog input during normal operation of the operational amplifier.

15. The method according to claim 10, wherein the calibration data is used to trim quiescent current of the operational amplifier.

16. The method according to claim 10, wherein the calibration data is used to trim offset voltage of the operational amplifier.

17. An operational amplifier, comprising:
    a pair of input pins and an output pin;
    analog devices coupled to the pair of input pins and the output pin, the analog devices being operative to amplify differences in signals on the pair of inputs and output an amplified difference signal, the analog devices including adjustable elements for adjusting a quiescent current of the operational amplifier; and
    non-volatile fuses coupled to the adjustable processing elements, the non-volatile fuses being electrically programmable to adjust the adjustable processing elements to alter the quiescent current;

wherein the quiescent current and an offset voltage are independently adjustable.

18. The operational amplifier according to claim 17, wherein the electronic component is an integrated circuit.

19. The operational amplifier according to claim 18, further comprising:

registers coupled to at least one of the input pins, the registers storing fuse configuration data received from a data pin.

20. The operational amplifier according to claim 19, further comprising:

a multiplexer coupled between outputs of the registers and outputs of the non-volatile fuses, and inputs to the adjustable elements;

wherein the multiplexer is operable to provide configuration data from the registers to the adjustable elements during a calibration mode and from the non-volatile fuses to the adjustable elements after programming of the analog component.

21. The operational amplifier according to claim 20, wherein the registers include serial registers for receiving the configuration data serially through the data pin.

22. The operational amplifier according to claim 21, wherein the data pin, a single clock pin and a single programming voltage pin of the operational amplifier are collectively operable to program the non-volatile fuses.

23. The operational amplifier according to claim 22, wherein at least one of the single data pin, the single clock pin and the single programming voltage pin is also usable as an analog input pin during normal operation.

24. The operational amplifier according to claim 20, wherein the configuration data includes fuse lock data that sets the multiplexer to route outputs of the non-volatile fuses to the adjustable elements.

25. The operational amplifier according to claim 23, further comprising:

a calibration state machine having inputs coupled to the clock pin and the signal programming voltage pin and outputs coupled to the registers and the non-volatile fuses, the calibration state machine being operable to control the programming of the registers and the non-volatile fuses based on signals received from the clock pin, the programming voltage pin and the data pin.

26. The operational amplifier according to claim 17, wherein the adjustable elements comprise:

a resistor stack biased by a current derived from the quiescent current and having a plurality of tap points; and a plurality of switches, each switch being coupled at one end to a respective one of the tap points and being coupled at the other end to each other switch, the non-volatile fuses being controllably coupled to the switches to select one of the tap points;

wherein the other end of the switch is coupled to a bias amplifier, the bias amplifier changing the quiescent current based on the selected tap point.

* * * * *